United States Patent [19]

MacIver et al.

[11] 4,144,100

[45] Mar. 13, 1979

[54] METHOD OF LOW DOSE PHOSHORUS IMPLANTATION FOR OXIDE PASSIVATED DIODES IN <100> P-TYPE SILICON

[75] Inventors: Bernard A. MacIver, Lathrup Village; Eugene Greenstein, Southfield, both of Mich.

[73] Assignee: General Motors Corporation, Detroit, Mich.

[21] Appl. No.: 856,643

[22] Filed: Dec. 2, 1977

[51] Int. Cl.$^2$ .................. H01L 21/265; H01L 7/54
[52] U.S. Cl. ........................... 148/1.5; 148/187; 357/20; 357/48; 357/59; 357/91
[58] Field of Search ............. 357/20, 59, 48, 91; 148/1.5, 187

[56] References Cited

U.S. PATENT DOCUMENTS

| | | | |
|---|---|---|---|
| 3,589,949 | 6/1971 | Nelson | 148/1.5 |
| 3,701,696 | 10/1972 | Mets | 148/175 |
| 3,821,783 | 6/1974 | Sugita et al. | 357/60 |
| 4,069,068 | 1/1978 | Beyer et al. | 148/1.5 |

OTHER PUBLICATIONS

Nelson, "Rad. Damage in S....," Proc. European Conf. on Ion Implantation (1970), p. 212.
Prussian et al., "...Ion Impl... I.C." J. Electrochem. Soc., 122 (1975), 830.
Prussian, "... Ion Implanted Si...," Journ. Appl. Phys. 45 (1974), 1635.
Prussian, "Ternary Defects... B, F, BF$_2$... Si..." in Ion Impl. in S/C, ed. S. Namba, Plenum, 1974, p. 449.
Golanski et al, "Annesling... Si... " Rad. Effects, 25 (1975) 213.
Poponiak et al., "Gettering... Implant Damage..." IBM-TDB, 19 (1976) 2052.
Dennis et al., Appl. Phys. Letts. 29 (1976) 523.
Fisher et al., "Defect... on Si... Oxidation" J. Electrochem. Soc. 120 (1973) 533.
Michel et al. "Annealing... PN Junctions in Si" J. Appl. Phys. 45 (1974) 2991.
Kirchner, "... Leakage Currents... PN Junctions" J. Appl. Phys. 46 (1975) 2167.
Geipel et al. "Electrochem. Soc. Meet., Los Vegas, Oct. 1976, Abstract Nr. 317.
Ryssel et al., "B. doping... Amorphous... Si..." Ion Impl. in S/C...", ed. B. L. Crowder, Plenum, 1972, p. 215.
Elkund et al., "Amorphization of Si...," Proc. 2nd Int. Conf. on Ion Impl., ed. RUGE et al., Springer, 1971, 103.
Mueller et al., "... B doping of Si... BF$_2$ Molecules" Ibid, 1971, p. 85.
MacIver et al, "Damage... B and BF$_2$... P$^+$N... in Si" J. Electrochem. Soc., Feb. 1977, vol. 124, p. 273.
Kriegler, ".. HCl and Cl$_2$... Stable SiO$_2$" Semiconductor Si, ed. Huff et al., 1973, p. 363.

Primary Examiner—L. Dewayne Rutledge
Assistant Examiner—Upendra Roy
Attorney, Agent, or Firm—Robert J. Wallace

[57] ABSTRACT

Low dosage phosphorus implantation regions in <100> P-type silicon are subjected to a severe damage implant with halogen or silicon ions, preferably fluorine and chlorine. This permits anneal in a strongly oxidizing atmosphere for PN junction passivation, without concurrently inducing PN junction leakage. Oxide passivated PN junctions are formed having leakages as low as when the low dose phosphorus implants are annealed in other atmospheres, or are formed in <111> silicon.

6 Claims, No Drawings

METHOD OF LOW DOSE PHOSHORUS IMPLANTATION FOR OXIDE PASSIVATED DIODES IN <100> P-TYPE SILICON

BACKGROUND OF THE INVENTION

This invention relates to implantation of phosphorus ions into silicon. It more particularly relates to an improved low dose phosphorus implantation method for <100> P-type silicon crystal faces, to permit anneal in a strongly oxidizing atmosphere for PN junction passivation, without concurrently inducing PN junction leakage.

A P-type surface portion of a monocrystalline silicon body can be doped to N-type conductivity by exposing the surface portion to a beam of phosphorus ions and then annealing the silicon body. The resultant N-type region forms a PN junction with unimplanted adjacent portions of the P-type silicon. In such annealing, the silicon body is heated to repair defects in the silicon crystal lattice caused by the implantation and move implanted phosphorus atoms to substitutional sites in the lattice. Annealing can be done in reducing, inert or oxidizing atmospheres. If done in a strongly oxidizing atmosphere, i.e., moist oxygen, the anneal will also produce a passivating silicon dioxide coating on the silicon surface over the PN junction.

Phosphorus implants greater than about $5 \times 10^{15}$ phosphorus ions per square centimeter in <100> P-type silicon can produce low leakage PN junctions when annealed in any suitable atmosphere, including moist oxygen. This is also true for phosphorus implants of any dose in <111> P-type silicon. Hence, if desired, the PN junction can be simultaneously oxide passivated during implantation anneal. This is particularly advantageous in the manufacture of integrated circuits. However, we have recognized that lower dose phosphorus implants in <100> silicon do not produce PN junctions of low leakage upon anneal in a strongly oxidizing atmosphere. Until now, if oxide passivation of diodes from such low dose phosphorus implants were desired, it had to be done in an extra step after anneal. Otherwise, one had to be content with a higher PN junction leakage.

Analogous differences between boron implants in <111> and <100> silicon are described in our earlier United States patent application Ser. No. 759,903, entitled "Improved Method of Boron Implantation for Oxide Passivated Diodes in <100> N-Type Silicon", filed Jan. 17, 1977 and assigned to the assignee of this invention. In our prior U.S. Ser. No. 759,903 we disclose adding a severe damage implant to boron implants in <100> silicon to obtain low leakage diodes from strongly oxidizing anneals. We have now found that with damage implants from certain selected ions, this effect can also be obtained from low dose phosphorus implants in <100> P-type silicon. Thus, diodes from low dose phosphorus implants in <100> silicon can now be oxide passivated during implantation anneal without also incurring the usual high PN junction leakage.

OBJECTS AND SUMMARY OF THE INVENTION

It is, therefore, an object of this invention to provide a new method of making silicon dioxide passivated, low dose phosphorus implanted PN junctions of low leakage in <100> P-type silicon crystal surfaces.

These and other objects of the invention are obtained by also providing a severe damage implant with a halogen or silicon ion to the low dose phosphorus implantation region before the region is annealed in a strongly oxidizing atmosphere. In a specific example of our method, a P-type <100> surface of a monocrystalline silicon body is given a non-amorphizing low dose phosphorus implant that would form an N-type region, and attendant PN junction, upon anneal. The phosphorus implanted region is then also implanted with fluorine or chlorine in a dosage sufficient to convert the implanted region to amorphous silicon. A dosage greater than about $3 \times 10^{15}$ ions per square centimeter at a rate of 1 microampere per square centimeter can be used. The silicon body is then heated to at least 900° C., preferably above 1000° C., in moist oxygen for a duration long enough to grow about a 5000 angstrom thick silicon dioxide coating on the silicon surface. During this heating, the amorphous silicon epitaxially reconverts to monocrystalline silicon, phosphorus atoms move to substitutional sites in the reconverted monocrystalline silicon crystal lattice, and a silicon dioxide passivated PN junction of low leakage results.

Other objects, features and advantages of this invention will become apparent from the following description of the preferred embodiments.

DESCRIPTION OF THE PREFERRED EMBODIMENTS

This invention is directed to an improved method of making PN junctions in <100> P-type silicon by phosphorus ion implantations below $5 \times 10^{15}$ ions per square centimeter. Phosphorus implant doses greater than about $5 \times 10^{15}$ phosphorus ions per square centimeter appear to always form low leakage diodes when annealed in moist oxygen for junction passivation. Low dose phosphorus implants do not. We believe that this difference exists because the higher dose phosphorus implants amorphize the implant region, and the low dose implants do not. At normal rates of about 1 microampere per square centimeter, phosphorus ion doses from about $2 \times 10^{15}$ ions per square centimeter to $5 \times 10^{15}$ ions per square centimeter provide significantly increasing degrees of surface damage. At about $5 \times 10^{15}$ ions per square centimeter, the damage becomes significant enough to convert the monocrystalline silicon to amorphous silicon. This has been confirmed by scanning electron microscopy. At higher dose rates, lower phosphorus dosages may produce this effect. However, it does not appear that phosphorus ion dosages below about $1 \times 10^{15}$ ions per square centimeter would convert the implanted region to amorphous silicon at any dose rate.

We recognize that there are different degrees of silicon damage at which one could classify the silicon as being converted from monocrystalline to amorphous silicon. Accordingly, by an amorphizing dosage, we mean a dosage that damages the <100> silicon sufficiently to permit a low leakage PN junction to be formed upon anneal in a strongly oxidizing atmosphere, i.e. moist oxygen. Conversely, a non-amorphizing phosphorus dosage in <100> silicon is a dosage that will produce high leakage diodes upon anneal in a strongly oxidizing atmosphere. A leakage of the order of 0.001 ampere per square centimeter or higher at about 75% of PN junction breakdown voltage is considered to be a high leakage.

By strongly oxidizing atmosphere, we mean an oxygen atmosphere having sifficient moisture added to it to grow a silicon dioxide layer at least about 3000 angstroms thick, preferably 5000 angstroms thick, on a clean silicon surface in about 100 minutes at about 1100° C. By a moist oxygen atmosphere, we mean an oxygen atmosphere in which water is included for at least 50% of the anneal time, usually during only a middle portion of the anneal. However, it may be included up to 90% of the anneal time, and even more, if desired. Water is conveniently added to the anneal atmosphere by routing the anneal atmosphere through a water bubbler at 96° C. before it enters the anneal furnace. Further, the anneal atmosphere can be moistened by adding steam to it as it enters the anneal furnace. Still further, water can be included in the anneal atmosphere as a product of a hydrogen and oxygen reaction.

In a specific example of this invention, circular diodes are fabricated in <100> oriented, 1 ohm-centimeter P-type polished silicon wafers. A 7000 angstrom thick thermal silicon dioxide coating was first grown over the entire surface of each wafer. The coating was grown in a manner that would provide effective masking of underlying silicon surface portions (e.g. pin-hole free) from ion beams to which the wafer was to be exposed. In this example the coating was formed by heating the wafers at 1100° C. for 60 minutes in oxygen moistened by bubbling through 96° C. water and then for 10 minutes in dry oxygen.

The wafers were then photolithographically masked and immersed in buffered hydrofluoric acid for selective etching. A plurality of circular openings about 0.038 centimeter in diameter were etched in the silicon dioxide coating on one face of each wafer in a pattern of rows and columns. The openings were spaced about 0.1 centimeter apart in rows and about 0.1 centimeter in the columns. Thus, the coating had an array of openings within each of which the P-type polished <100> silicon surface was exposed.

Phosphorus was implanted into all the openings on each wafer face at a beam energy of 115 keV in a dosage of $5 \times 10^{14}$ phosphorus ions per square centimeter at a normal dose rate of 1 microampere per square centimeter. Then, mechanically masking one-half of each wafer face, fluorine was implanted into the exposed openings at a beam energy of 55 keV. Each wafer half was given a different fluorine dose, ranging from $2 \times 10^{14}$ fluorine ions per square centimeter to above $1 \times 10^{16}$ fluorine ions per square centimeter. For all implants, the wafers were positioned at 7° from normal to the ion beam axis to minimize channeling, and the implants were at normal rates. Phosphorus and fluorine implant depths were about 1400 angstroms.

After implantation the wafers were annealed at 1100° C. in a 5 centimeter diameter furnace tube through which flowed a strongly oxidizing atmosphere. The atmosphere was dry oxygen for 30 minutes, bubbled through 96° C. water for 60 minutes, and dry oxygen for a final 10 minutes. Atmosphere flow was about 1.7 liters per minute, a typical rate. The anneal not only activated and redistributed the phosphorus within the silicon but also grew a silicon dioxide coating about 5000–7000 angstroms thick within the implantation openings previously made in the initial silicon dioxide coating.

A contact window was then photolithographically opened within each implant opening in each of the wafers for application of aluminum contacts. A blanket coating of aluminum was deposited onto the wafer face over the contact windows, and discrete circular contacts defined over each window. The wafers were then heated at 480° C. in forming gas for 10 minutes to sinter each contact. The wafers were then ready for measuring diode leakage current. Contacts were probed with 30 volts reverse bias applied ($V_{BD}$ about 42 volts) to evaluate the leakage currents of their respective PN junctions. The PN junctions of at least 25 diodes on each wafer half were thus tested.

Diodes formed without the added fluorine implant exhibited leakages of at least 1 milliampere per square centimeter, and generally more than 0.01 ampere per square centimeter. The diodes have the added fluorine implant did not show a significant reduction in leakage unless the fluorine implant dosage was at least about $3 \times 10^{15}$ ions per square centimeter. Leakage reduction was largest and consistently obtained with fluorine dosages of $5 \times 10^{15}$ ions per square centimeter, with which reductions to $1 \times 10^{-8}$ amperes per square centimeter were consistently observed. No added benefit was seen with fluorine dosages of the order of $10^{16}$ ions per square centimeter. Accordingly, a fluorine dose of at least about $3 \times 10^{15}$ ions per square centimeter was needed in this example to gain a significant reduction in leakage current. A dose of $5 \times 10^{15}$ fluorine ions per square centimeter would be preferred. However, it should be recognized that the amorphizing fluorine dose required is also somewhat dependent on the amount of damage done to the silicon crystal by the phosphorus implant and the rate of the fluorine implant. Damage by the phosphorus ions and the fluorine ions are cumulative.

Tests have also been conducted with chlorine and silicon implants substituted for the fluorine implant. Analogous results were obtained. For example, a $5 \times 10^{15}$ ions per square centimeter dose of chlorine ions at 50 keV was substituted for the fluorine dose in a test otherwise identical to that described above. Diode leakage was reduced to $5 \times 10^{-6}$ ampere per square centimeter. A dose of $5 \times 10^{15}$ silicon ions per square centimeter at 70 keV reduced diode leakage to about $1 \times 10^{-5}$ ampere per square centimeter in another similar test. It is believed that analogous results can be obtained with bromine implants over low dose phosphorus implants in the <100> silicon. On the other hand, damage implants with inert gas or nitrogen ions do not appear to be of any significant benefit.

The area of the amorphizing implant should at least be substantially coextensive with the phosphorus implant, and preferably following the phosphorus implant. If the amorphizing implant covers a greater area, it is not believed to provide any increased benefits. On the other hand, it is not believed that the amorphizing implant must be of the same depth as the phosphorus implant. Apparently, a significant surface thickness must be amorphized, perhaps irrespective of the phosphorus implantation depth. The aforementioned chlorine and silicon implants were to respective depths of about 500 angstroms and 1000 angstroms. The phosphorus implant depth was about 1400 angstroms. It is believed that similar results would be obtained with equally shallow fluorine implants. Amorphizing implants of only a few hundred angstroms may only be required. Further, it is believed that these effects can be achieved with phosphorus implants of any depth, including depths from 500 angstroms to 4200 angstroms.

In passivating the PN junction according to this invention, a silicon dioxide coating is thermally grown over it during implantation anneal. Implantation effects on the monocrystal are removed long before the passivating silicon dioxide coating can be grown. Accordingly, the preferred time for anneal will principally be a function of the anneal temperature and the desired passivating coating thickness. Such silicon dioxide coatings are usually grown in a strongly oxidizing atmosphere at a temperature of at least 900° C., and preferably greater than 1000° C. We ordinarily use a temperature of approximately 1000°–1200° C.

Strongly oxidizing atmospheres are used to grow passivating and masking oxides on silicon, particularly in integrated circuit processes. It is highly advantageous to produce this oxide growth during implantation anneal, rather than in a subsequent heating operation. By this invention one can now use low dose phosphorus implants in <100> silicon and still obtain the advantage of oxide growth during anneal and the advantage of low leakage PN junctions. Such implants can be useful for source and drain regions of insulated gate transistors and for emitter regions of bipolar transistors, especially in integrated circuits.

We think that the higher diode leakage currents previously obtained upon anneal in strongly oxidizing atmospheres was due to gross dislocation defects in the monocrystalline silicon. Leakage current of diodes in the <111> silicon may be independent of anneal atmospheres because the defects lie in the <111> plane of the monocrystal. They may not intersect the PN junction as they do in the <100> silicon material. We have noted that many dislocation defects are at least about 4 micrometers in length, which is sufficient to penetrate a 2 micrometers deep PN junction in the <100> silicon. The excess leakage is probably due to strain introduced during the oxidation process or to metal oxide or silicon dioxide precipitated along the dislocations. Apparently the presence of the amorphous surface layer during implantation anneal in a strongly oxidizing atmosphere inhibits the growth of dislocation defects in the implantation area, where they can contribute to junction leakage currents.

The additional implantation of fluorine, chlorine, bromine or silicon is a damage implant. These selected ions convert the implanted area to amorphous silicon after the phosphorus implantation and provide an improvement in PN junction leakage. The effects of these selected ions and of the phosphorus ions are cumulative. Hence, the greater the damage produced by the phosphorus implant, the lesser the additional damage needed by the above-mentioned selected ions. Correspondingly, the higher the phosphorus dosage, the lesser the amorphizing dosage of the selected aforementioned ions that is required. Also, amorphizing dosage can be affected by the type of species used for the phosphorus implant. For example, $PF_2$ ions can be used to implant phosphorus instead of phosphorus ions. This species produces a greater degree of crystal damage than phosphorus ions. A correspondingly lesser dose of the above-mentioned selected ions can thus be effective in amorphizing the implant region. In some instances then, a damage implant of less than about $3 \times 10^{15}$ ions per square centimeter of fluorine or equivalent ions might be effective to convert the phosphorus implant region to amorphous silicon. This lesser dosage is thus still considered to be in amorphizing dosage.

The embodiments of the invention in which an exclusive property or privilege is claimed are defined as follows:

1. In a method of making a low leakage, oxide passivated PN junction by low dosage ion implantation of phosphorus in a P-type region on a <100> face of a silicon monocrystal, which implantation is in a non-amorphizing dosage below $5 \times 10^{15}$ phosphorus ions per square centimeter, the improvement wherein prior to implantation anneal at least one ion selected from the group consisting of fluorine ions, chlorine ions, bromine ions, and silicon ions is also implanted in said region in an amorphizing dosage to produce a low leakage oxide passivated PN junction when said region is annealed in a strongly oxidizing atmosphere, and then annealing said region in a strongly oxidizing atmosphere at a temperature above about 900° C. to form said PN junction and concurrently grow a passivating silicon dioxide coating thereover, whereby said low leakage PN junction is produced and simultaneously passivated during implantation anneal.

2. In a method of making a low leakage, oxide passivated PN junction by low dosage ion implantation of phosphorus in a P-type region on a <100> face of a silicon monocrystal, which implantation is in a non-amorphizing dosage below $5 \times 10^{15}$ phosphorus ions per square centimeter, the improvement wherein prior to implantation anneal at least one ion selected from the group consisting of fluorine ions, chlorine ions, bromine ions, and silicon ions is also implanted in said region effective to convert said region to amorphous silicon and provide a low leakage oxide passivated PN junction when said region is annealed in a strongly oxidizing atmosphere, and then annealing said region is a strongly oxidizing atmosphere at a temperature above about 1000° C. to form said PN junction and concurrently grow a passivating silicon dioxide coating thereover, whereby said low leakage PN junction is produced and simultaneously passivated during implantation anneal.

3. In a method of making a low leakage, oxide passivated PN junction by low dosage ion implantation of phosphorus in a P-type region on a <100> face of a silicon monocrystal, which implantation is in a non-amorphizing dosage below about $5 \times 10^{15}$ phosphorus ions per square centimeter, the improvement wherein prior to implantation anneal at least one ion selected from the group consisting of fluorine ions and chlorine ions is also implanted in said region in an amorphizing dosage to provide a low leakage oxide passivated PN junction when said region is annealed in a moist oxygen atmosphere, and then heating the monocrystal in a moist oxygen atmosphere at a temperature of about 1000° C. to anneal said region and concurrently grow a passivating silicon dioxide coating thereover, whereby said low leakage PN junction is simultaneously produced and oxide passivated in one heating operation.

4. In a method of making a low leakage, oxide passivated PN junction by low dosage phosphorus ion implantation in a P-type region on a <100> face of a silicon monocrystal, which implantation is in a non-amorphizing dosage below about $2 \times 10^{15}$ phosphorus ions per square centimeter, the improvement wherein after phosphorus implantation and prior to implantation anneal at least one ion selected from the group consisting of fluorine ions and chlorine ions is also implanted in said phosphorus implanted region in an amorphizing dosage to permit a low leakage oxide passivated PN junction to be formed when said region is annealed in a strongly oxidizing atmosphere, and then annealing said region in a moist oxygen atmosphere at a temperature of about 1000°–1200° C. to form said PN junction and concurrently grow a passivating silicon dioxide coating at least about 3000 angstroms thick thereover, whereby said low leakage PN junction is produced and simultaneously passivated during implantation anneal.

5. In a method of making a low leakage, oxide passivated PN junction by low dosage ion implantation of phosphorus in a P-type region on a <100> face of a silicon monocrystal, which implantation is in a dosage below about $1 \times 10^{15}$ phosphorus ions per square centimeter, the improvement wherein after phosphorus implantation and prior to anneal, the phosphorus implanted region is connected to amorphous silicon by also implanting therein at least one ion selected from the group consisting of fluorine ions and chlorine ions in a dose equivalent to at least about $3 \times 10^{15}$ fluorine ions per square centimeter at a rate of 1 microampere per square centimeter, whereby a low leakage PN junction can be simultaneously produced and oxide passivated upon implantation anneal in a moist oxygen atmosphere, and then annealing said region in a moist oxygen atmosphere at a temperature of about 1000°-1200° C. for 1-5 hours to concurrently form said low leakage PN junction by annealing said region and grow a passivating silicon dioxide coating at least about 3000 angstroms thick over said PN junction.

6. In a method of making a low leakage, oxide passivated PN junction by low dosage phosphorus ion implantation in a P-type region on a <100> face of a silicon monocrystal, which implantation is in a dosage below $1 \times 10^{15}$ phosphorus ions per square centimeter, the improvement wherein prior to implantation anneal the region implanted with phosphorus is given an implant of at least one ion selected from the group consisting of fluorine ions and chlorine ions effective to convert said phosphorus implanted region to amorphous silicon and provide a low leakage oxide passivated PN junction when said region is annealed in a strongly oxidizing atmosphere, and then heating said monocrystal in a moist oxygen atmosphere at a temperature of about 1000°-1200° C. for about 1-5 hours to concurrently epitaxially convert said amorphous silicon region to N-type monocrystalline silicon, form a PN junction between said region and adjacent unimplanted P-type silicon, and grow a passivating silicon dioxide coating at least 5000 angstroms thick thereover, whereby a PN junction of low leakage is produced and simultaneously passivated during the implantation anneal.

* * * * *